(12) United States Patent
Jacob et al.

(10) Patent No.: US 6,920,059 B2
(45) Date of Patent: Jul. 19, 2005

(54) REDUCING EFFECTS OF NOISE COUPLING IN INTEGRATED CIRCUITS WITH MEMORY ARRAYS

(75) Inventors: Michael Jacob, Kanagawa (JP); Thomas Roehr, Kanagawa (JP); Norbert Rehm, Kanagawa (JP); Daisaburo Takashima, Tokyo (JP)

(73) Assignees: Infineon Technologies Aktiengesellschaft, Munich (DE); Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 10/065,921

(22) Filed: Nov. 29, 2002

(65) Prior Publication Data

US 2004/0105293 A1 Jun. 3, 2004

(51) Int. Cl.[7] ............................................. G11C 11/22
(52) U.S. Cl. .................. 365/145; 365/149; 365/230.03
(58) Field of Search ............................. 365/145, 149, 365/230.03

(56) References Cited

U.S. PATENT DOCUMENTS

| | | | | |
|---|---|---|---|---|
| 5,400,275 A | | 3/1995 | Abe et al. | |
| 5,517,446 A | * | 5/1996 | Ihara | 365/145 |
| 5,745,402 A | | 4/1998 | Arase | |
| 6,236,588 B1 | * | 5/2001 | Koo | 365/145 |
| 6,366,490 B1 | * | 4/2002 | Takeuchi et al. | 365/145 |
| 6,411,540 B1 | * | 6/2002 | Ashikaga | 365/145 |
| 6,493,251 B2 | * | 12/2002 | Hoya et al. | 365/145 |
| 6,574,135 B1 | * | 6/2003 | Komatsuzaki | 365/145 |
| 2002/0054501 A1 | * | 5/2002 | Honigschmid et al. | 365/145 |
| 2004/0057275 A1 | * | 3/2004 | Roehr et al. | 365/148 |

FOREIGN PATENT DOCUMENTS

DE  199 19 360 A1  11/2000

* cited by examiner

*Primary Examiner*—Richard Elms
*Assistant Examiner*—Toan Le
(74) *Attorney, Agent, or Firm*—Horizon IP Pte Ltd (57) ABSTRACT

A method for reducing noise coupling in a memory array is disclosed. The memory array includes a plurality memory cells interconnected by wordlines, bitlines, and platelines. The memory cells are arranged in columns having first and second bitlines coupled to a sense amplifier. During a memory access, at least adjacent bitlines pairs are not activated. The selected bitline pair or pairs are provided with a plateline pulse.

43 Claims, 7 Drawing Sheets

FIG 1

PRIOR ART

REDUCING EFFECTS OF NOISE COUPLING IN INTEGRATED CIRCUITS WITH MEMORY ARRAYS

BACKGROUND OF INVENTION

Figure 1:
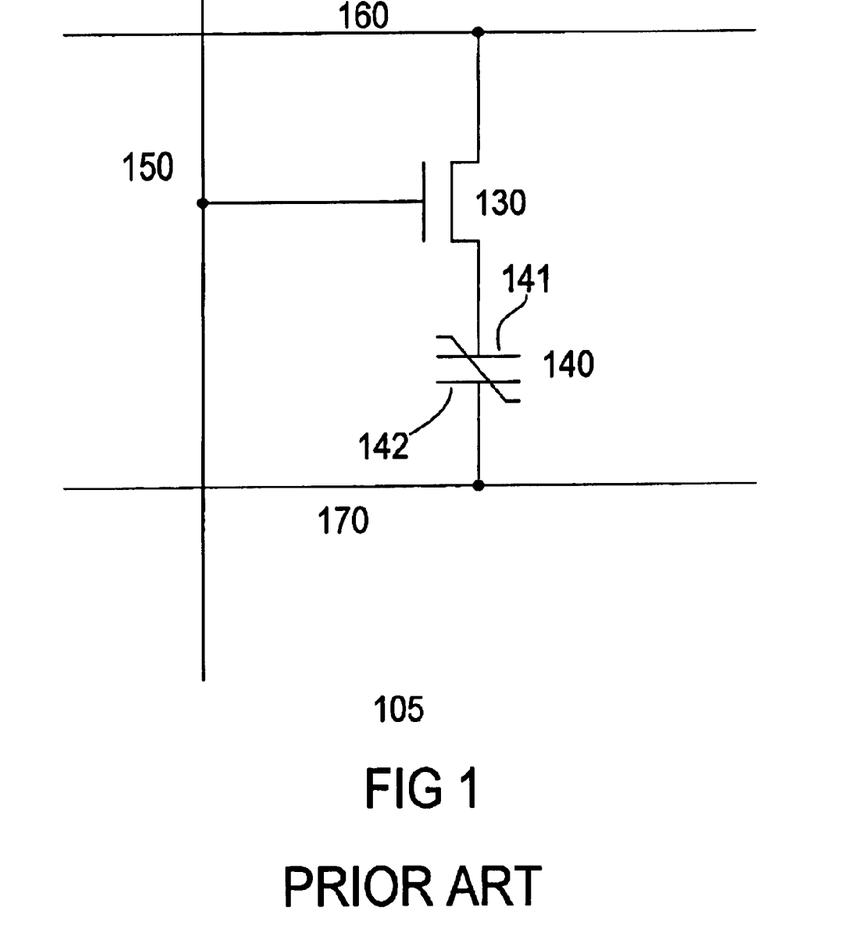
FIG. 1 shows a conventional ferroelectric memory cell.

Ferroelectric metal oxide ceramic materials such as lead zirconate titanate (PZT) have been investigated for use in ferroelectric semiconductor memory devices. Other ferroelectric materials, for example strontium bismuth tantalate (SBT), can also be used. FIG. 1 shows a conventional ferroelectric memory cell 105 having a transistor 130 and a ferroelectric capacitor 140. An electrode 142 is coupled to a plateline 170 and another electrode 141 is coupled to the transistor which selectively couples or decouples the capacitor from a bitline 160, depending on the state (active or inactive) of a wordline 150 coupled to the transistor gate.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

A plurality of memory cells are interconnected by wordlines, bitlines, and platelines to form a memory array. Bitlines are coupled to sense amplifiers to facilitate memory accesses, such as reads and writes. Typically, a sense amplifier is coupled to a pair of bitlines, forming a bitline pair or column of the array. A wordline is coupled to a memory cell from each column, forming a row. The sense amplifiers are coupled to a column decoder and the wordlines are coupled to a row decoder.

During a read memory access, the bitlines of the memory array are precharged to, for example, 0 volts. After the bitlines are precharged, a wordline is selected by the row decoder depending on the row portion of the address, coupling a row of memory cells to respective bitlines. A plateline pulse is then provided on the platelines. The pulse, for example, is about 2.5 V. The pulse creates an electric field across the capacitor of the memory cell of the selected row. This field produces a voltage or a differential read signal on the bitline pair to which the cell is coupled. The differential signal can either be a first or a second voltage value, representing first and second logic level stored in the selected memory cell (e.g., logic 0 or logic 1).

In conventional memory architectures, a row of memory cells are sensed simultaneously (e.g., all bitline pairs of the memory block are read out simultaneously). The column decoder selects one of the sense amplifiers according to the column portion of the address for outputting its information onto, for example, a data line. For architectures with more than one data lines, more than one sense amplifier can be selected simultaneously. One sense amplifier is selected for each data line.

During a memory access, signals on adjacent bitlines of neighboring bitline pairs may have different logic level signals. For example, a bitline may be a logic 1 or logic 0. Also, in some applications, a bitline can have a logic level equal to a reference voltage such as $V_{DD}/2$. Due to the proximity of the bitline pairs, the signal on one bitline of a bitline pair can affect the signal on an adjacent bitline of another bitline pair. This is referred to as bitline noise coupling effect. For example, two adjacent bitlines from adjacent bitline pairs have different signals (e.g., one has a logic 1 while the other has a logic 0). The one with the logic 1 read signal will pull logic 0 read signal of the other bitline pair higher while the logic 0 read signal will pull the logic 1 read signal of the other bitline pair lower. There may also be a case where one of the adjacent bitlines of two adjacent bitline pairs has either a logic 1 or logic 0 signal while the other has a reference voltage level signal (e.g., $V_{DD}/2$). The bitline with the reference voltage level would be pulled higher by the adjacent bitline if it has a logic 1 signal or lower if it has a logic 0 signal.

Noise coupling effect of adjacent bitline pairs can reduce read signal margin of the differential signal, which reduces reliability and yields. This problem of noise coupling becomes worse with smaller groundrules. To compensate for the reduced read signal, larger voltage levels may be needed. However, this results in higher power consumption and chip area penalty.

As evidenced from the foregoing discussion, it is desirable to reduce the impact of coupling noise to avoid degrading or reducing the signal margin of a differential signal.

SUMMARY OF INVENTION

The invention relates to memory arrays, and more particularly to reducing noise, coupling in memory arrays. In one embodiment, the memory array includes a plurality of memory cells interconnected by wordlines, bitlines, and platelines. In one embodiment, the memory cells comprise ferroelectric memory cells. Other types of memory cells are also useful. The memory cells are arranged in columns, wherein a column includes first and second bitlines coupled to a sense amplifier. During a memory access, a column is selected. The column is activated and provided with a plateline pulse.

DETAILED DESCRIPTION

Figure 2:
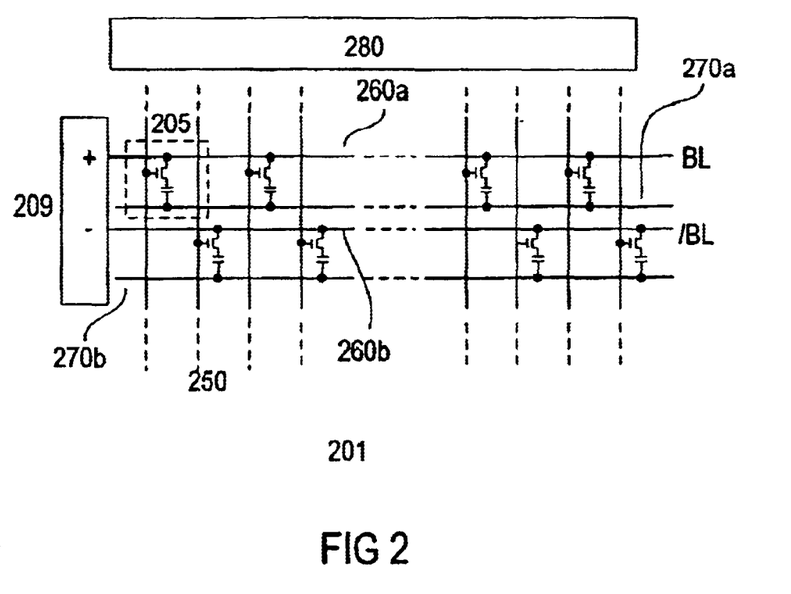
FIGS. 2–4 show various ferrolectric memory architectures.

The invention relates to reducing noise coupling effects in ICs with an array of memory cells. In one embodiment, the memory cells are ferroelectric memory cells. The invention is also applicable to other types of memory cells employing platelines. FIG. 2 shows a portion 201 of an array of ferroelectric memory cells 205 in accordance with one embodiment of the invention. The memory array, for example, is part of an IC, such as ferroelectric memory IC. Other types of ICs including embedded ICs, are also useful. As shown, the portion includes a pair of bitlines 260a–b coupled to a sense amplifier 209. One bitline, for example, is referred to as bitline true (BL) and the other is referred to as bitline complement (/BL). A plurality of memory cells are coupled to the bitlines. Wordlines are coupled to the memory cells in a row direction for addressing purposes. Platelines, in one embodiment, are coupled to the memory cells in the column direction.

Figure 3:
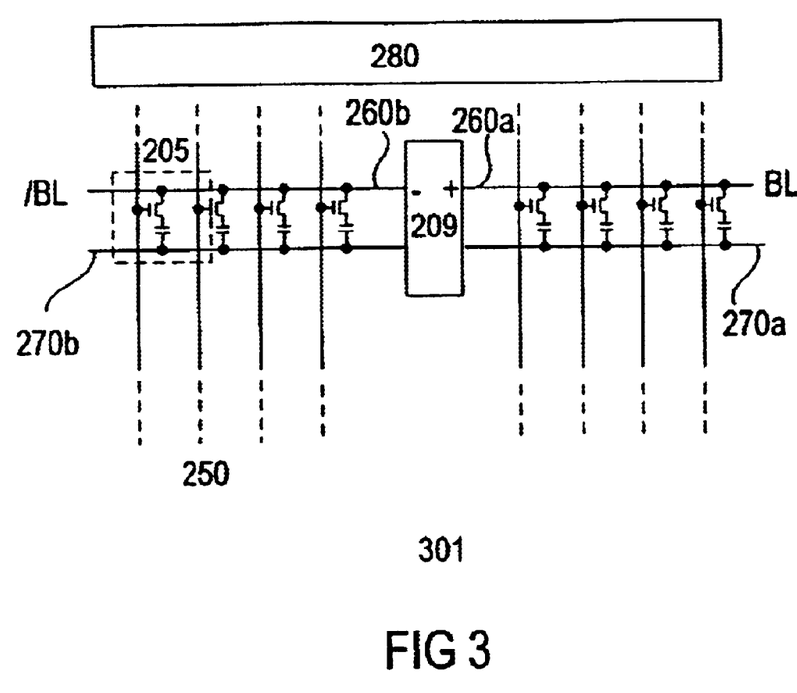

In one embodiment, the memory cells are arranged in a folded-bitline architecture. In the folded-bitline architecture, the bitlines of the bitline pair are adjacent to each other. Adjacent wordlines are coupled to memory cells of a different bitline of the bitline pair. To form a memory array, a plurality of bitline pairs are interconnected by wordlines. The sense amplifiers are coupled to a column decoder and the wordlines are coupled to a row decoder. The platelines are coupled to a plateline decoder. Arranging the memory cells in an open bitline architecture, as shown in FIG. 3, are also useful. In the open bitline architecture, the bitlines of a bitline pair are on opposite sides of the sense amplifier (e.g., not adjacent to each other).

Figure 4:
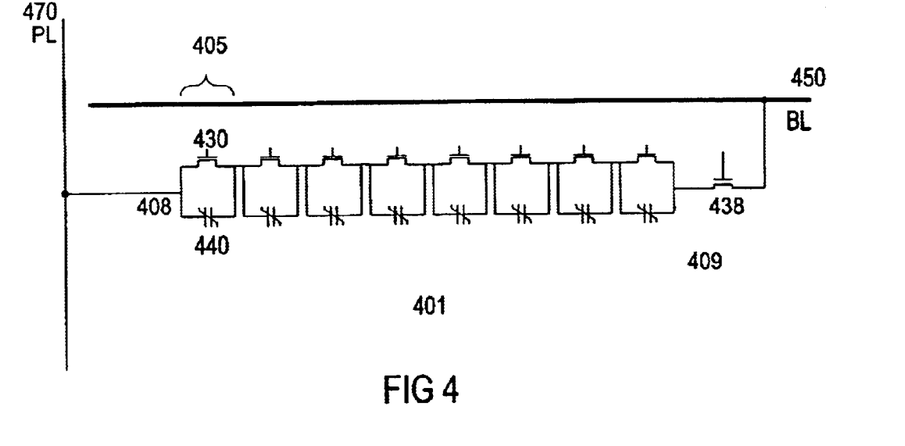

In another embodiment of the invention, the memory cells are arranged in groups to form a series architecture. Series architectures are described in, for example, Takashima et al., "High Density Chain Ferroelectric Random Access Memory (chain FRAM)", IEEE Jrnl. of Solid State Circuits, vol.33, pp.787–792, May 1998, which is herein incorporated by reference for all purposes. Referring to FIG. 4, a group of memory cells 405 is shown. The memory cells of the group, each having a transistor 430 coupled to a ferroelectric capacitor in parallel, are coupled in series. One end 408 of the group is coupled to a plateline 470 while the other end 409 is coupled to a bitline 450. In one embodiment, a select transistor 438 is coupled to the other end of the group and the bitline. When the select transistor is activated, the group of memory cells is coupled to the bitline.

A plurality of groups are interconnected by wordlines, platelines, and bitlines to form an array. The bitlines are grouped into pairs, each pair coupled to a sense amplifier. The bitlines can be arranged in a folded or open architecture. Other types of architectures are also useful.

As described, a ferroelectric memory cell of the array includes one transistor and one capacitor (1T1C). Providing an array of ferroelectric cells wherein each cell comprises two transistors and two capacitors are also useful (2T2C). Such 2T2C architectures are described in, for example, Bondurant et al., "Ferroelectrics for nonvolatile RAMs," IEEE spectrum, p.30–33 July, 1989, which is herein incorporated by reference for all purposes.

Figure 5:
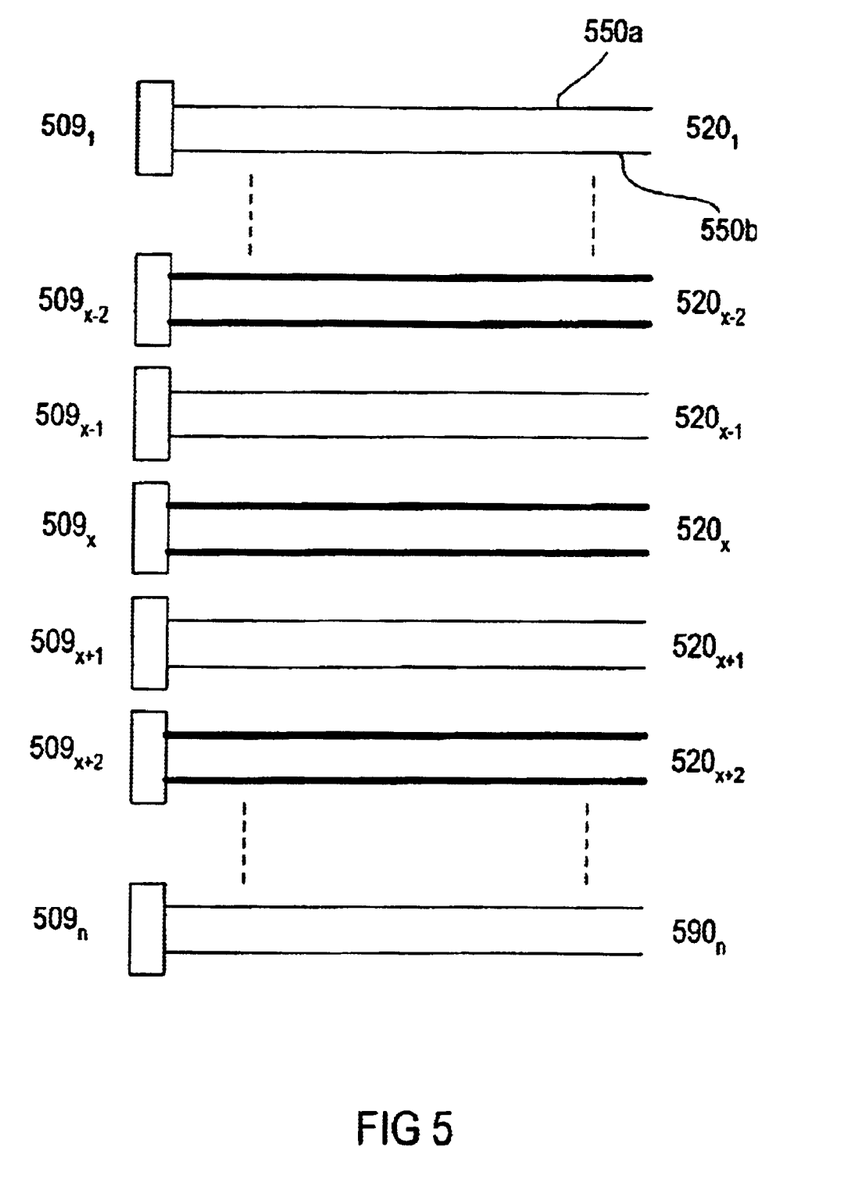
FIGS. 5–7 show various embodiments of the invention for reducing noise coupling in ferroelectric memory arrays.
Figure 6:
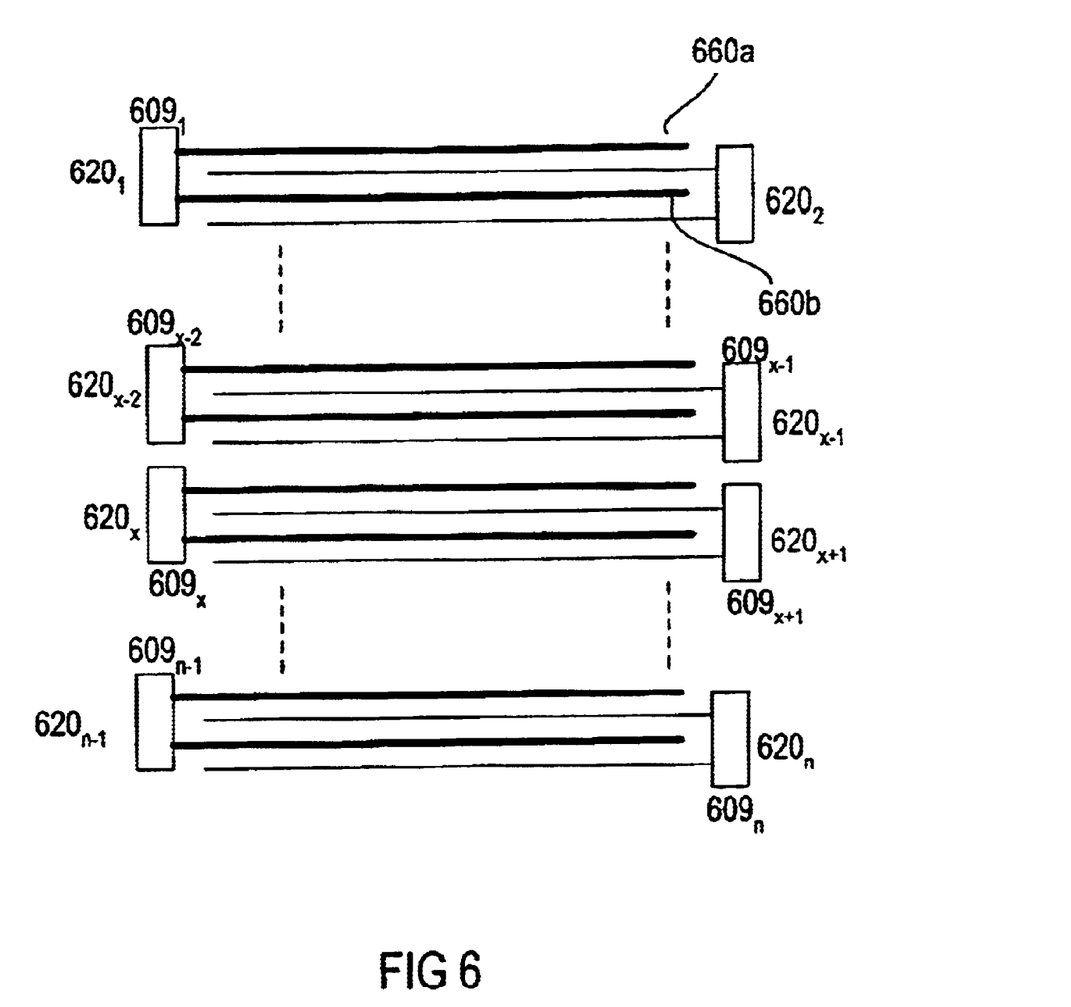
Figure 7:
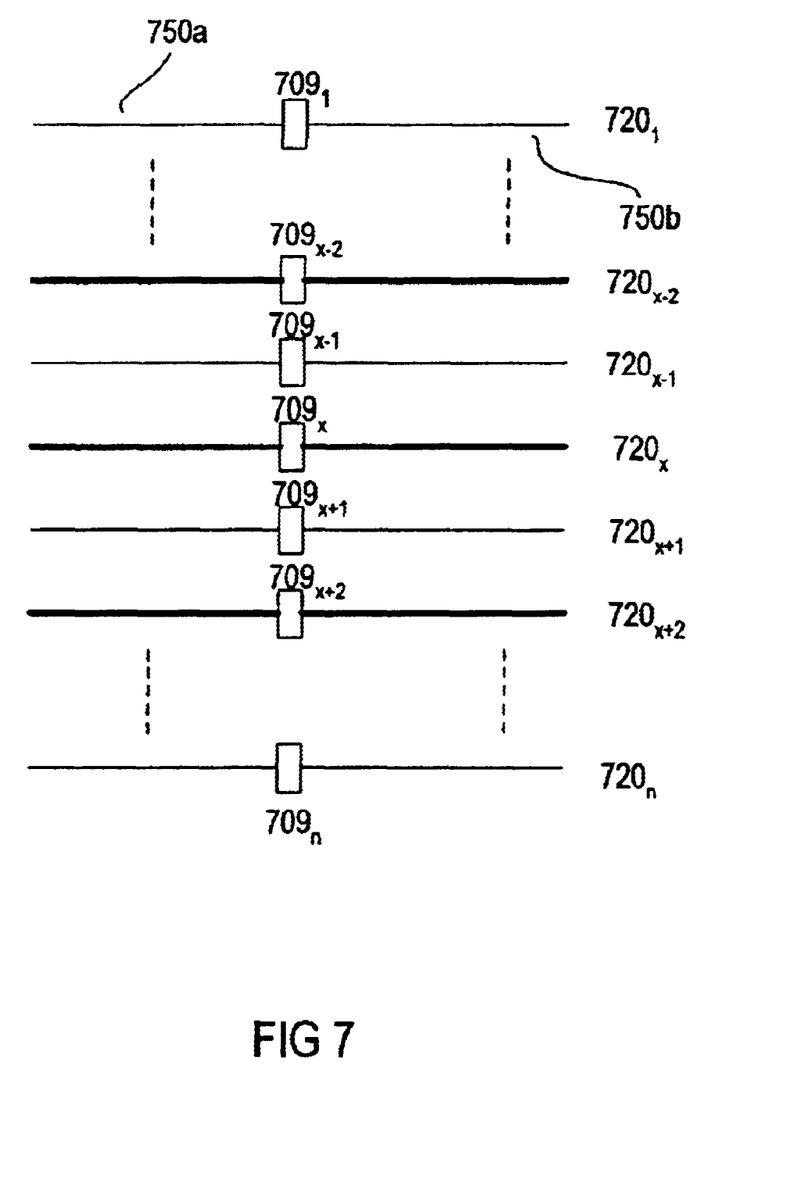

FIGS. 5–7 show various embodiments of the invention for reducing bitline coupling noise in ferroelectric memory arrays in accordance with the invention. Referring to FIG. 5, a memory array 501 is shown. The array includes a plurality of bitlines 550, each comprising a plurality of memory cells (not shown) coupled thereto. In one embodiment, the memory cells are ferroelectric memory cells. The memory cells, for example, can be memory cells of the type shown in FIG. 1 or arranged in a series architecture as shown in FIG. 3. Other types of memory cells are also useful. In one embodiment, a bitline is associated with a plateline (not shown). Providing a plateline associated with a column is also useful. The bitlines are grouped into n pairs 520, where n is a whole number. The subscript portion of the reference numbers identifies which bitline pair of the array with which it is associated. Preferably, n is equal to $2^y$, where y is a whole number. For example, the array comprises $2^{16}$ bitline pairs. Arrays with other numbers of bitline pairs are also useful. A bitline pair includes first and second bitlines 550a–b coupled to a sense amplifier 509. The sense amplifiers are controlled by a column decoder, the platelines are controlled by a plateline decoder, and the wordlines are controlled by row decoders.

During an access (e.g., a read), generally one memory cell is selected from the array. The bitline pair to which the selected memory cell is coupled is referred to as the selected bitline pair. In one embodiment, only the selected pair of the array is activated. Activating other bitline pairs in addition to the selected pair is also useful. This is particularly useful for page mode operations to increase access performance.

Selecting more than one bitline pair for activation is also useful during an access for applications having more than one data line. In another embodiment, the array can be separated into subarrays, each associated with a data line for outputting data from the array. One cell is selected from each subarray for the access. Alternatively, more than one data lines are provided for each subarray. Other types of memory architectures are also useful.

In one embodiment, when more than one bitline pair is activated (or selected for activation) during an access, at least adjacent bitline pairs of the selected bitline pairs are not activated. Preferably, n number of adjacent bitline pairs of the selected bitline pairs are inactivated, where n is at least 1. Keep in mind that the number of inactivated adjacent bitline pairs on both sides of an activated bitline pair need not be the same. Additionally, it is not necessary that all the selected bitline pairs have the same number of inactivated adjacent bitline pairs.

In an illustrative embodiment, one bitline pair $520_x$ is selected. The selected bitline pair and alternate bitline pairs (e.g., $520_{x\pm 2}$) from the selected bitline pairs are also activated. The activated bitline pairs are indicated by bolded bitlines. In this example, n is equal to 1. Providing n equal to other number or numbers is also useful. The activated bitline pairs can be used for outputting data onto data lines, or used for page mode type operations, or a combination thereof.

In one embodiment, the plateline pulse is provided to the bitlines of the activated bitline pair or pairs. The plateline pulse, for example, is a logic 1. Providing plateline pulses having other logic levels, such as logic 0 or a combination of both is also useful. No plateline pulses are provided to non-activated bitline pairs. In one embodiment, selectively providing the plateline pulse to the activated bitline pairs is achieved with the plateline decoder.

In a preferred embodiment, the bitlines of the non-activated bitline pairs are set to a defined state. The defined state should be selected to reduce the noise coupling effects. The defined state can be, for example, a static potential. In one embodiment the static potential is equal to the precharge potential of the bitlines in preparation, for example, of the memory access. Other static potentials, such as reference voltage, logic 1, logic 0, or a combination thereof, can also be useful. The reference voltage is, for example, equal to about $V_{DD}/2$, where $V_{DD}$ is the operating voltage of the IC. Other reference voltage levels are also useful. A reference voltage source can be coupled to the sense amplifier to set the bitlines to the defined potential. If the defined state is different from the precharge potential, a different reference voltage source is provided to set the non-activated bitlines to the defined state. The column decoder can be used to determine which voltage source (e.g., precharge source or defined state source) to select for the memory access. In one embodiment, the inactivated bitline pairs are floated. Floating the bitline pairs in one embodiment, is achieved by isolating them from the sense amplifiers.

Referring to FIG. 6, an alternative embodiment of the invention is shown. As shown, an array 601 of ferroelectric memory cells includes a plurality of bitline pairs $620_{1-n}$. The memory cells can be memory cells of the type shown in FIG. 1 or arranged in a series architecture as shown in FIG. 3. Other types of memory cells are also useful. The bitlines are configured in a folded bitline architecture where the bitlines of a bitline pairs are adjacent (e.g., on the same side of the sense amplifier). In one embodiment, the bitlines of bitline pairs are interleaved with other bitline pairs. That is, bitlines of a bitline pair are separated by at least one bitline from another bitline pair. As shown, bitlines of a bitline pair are separated by a bitline from one of the adjacent bitline pairs. The sense amplifier of adjacent bitline pairs are located, for example, on opposite ends of the bitlines. Interleaving a bitline pair with t bitlines from other bitline pairs is also useful, where t is greater than or equal to 1.

During a memory access, only the selected bitline pair is activated. For applications where more than one bitline pair is activated, at least adjacent bitline pairs of the selected bitline pairs are not activated. Preferably, n number of adjacent bitline pairs of the selected bitline pairs are inactivated, where n is at least 1. In one embodiment, the selected bitline pair and alternate pairs therefrom are activated. For example, the selected bitline pair $620_x$ and every other bitlines from the selected bitline pair (as indicated by the bolded bitlines) are activated. The bitlines are activated as previously described. Also, the non-activated bitlines can be set to a defined state as already described.

Referring to FIG. 7, an array 701 of ferroelectric memory cells is shown. The memory cells, for example, are arranged in a series architecture. Other types of memory cells, as shown in FIG. 1, or other types of ferroelectric memory cells are also useful. The array includes a plurality of bitline pairs $720_{1-n}$ arranged in an open bitline architecture. Bitlines 750a–b of a bitline pair 720 are located on opposite sides of a sense amplifier 709. The memory cells of a bitlines are coupled to respective wordlines. In one embodiment, a bitline is associated with a plateline (not shown). The sense amplifiers are controlled by column decoder, the platelines are controlled by a plateline decoder, and the wordlines are controlled by row decoders.

During a memory access, only the selected bitline pair is activated. For applications where more than one bitline pair is activated, at least adjacent bitline pairs of the selected bitline pairs are not activated. Preferably, n number of adjacent bitline pairs of the selected bitline pairs are inactivated, where n is at least 1. In one embodiment, the selected bitline pair and alternate pairs therefrom are activated. For example, the selected bitline pair $720_x$ and every other bitlines from the selected bitline pair (as indicated by the bolded bitlines) are activated. The bitlines are activated as previously described. Also, the non-activated bitlines can be set to a defined state as already described.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of operating a memory array with reduced noise coupling comprising:
   providing the memory array having a plurality memory cells interconnected by wordlines, bitlines, and platelines, the memory cells of the array are arranged in a plurality of columns, a column comprises a bitline pair having first and second bitlines coupled to a sense amplifier;
   performing a memory access to the array, the access selects one of the columns of memory cells; and
   providing a plateline pulse to only the selected column while non-selected columns are not provided with the plateline pluse.

2. The method of claim 1 wherein the memory cells are ferroelectric memory cells.

3. The method of claim 2 wherein the memory cells of the array are arranged in an open bitline, a folded bitline, or a series architecture.

4. The method of claim 1 wherein the memory cells of the array are arranged in an open bitline, a folded bitline, or a series architecture.

5. The method claim 1 wherein non-selected bitlines are set to a defined state.

6. The method of claim 5 wherein the defined state is selected to equal to logic 1, logic 0, reference voltage, or a combination thereof.

7. The method of claim 6 wherein the reference voltage is equal about $V_{DD}/2$.

8. The method of claim 7 wherein the non-selected bitlines are floated.

9. The method of claim 8 wherein a plateline decoder coupled to the platelines provides the plateline pulse to the selected column.

10. The method of claim 7 wherein the plateline pulse is equal to logic 1 or logic 0.

11. The method of claim 10 wherein a plateline decoder coupled to the platelines provides the plateline pulse to the selected column.

12. The method of claim 7 wherein a plateline decoder coupled to the platelines provides the plateline pulse to the selected column.

13. The method of claim 6 wherein the plateline pulse is equal to logic 1 or logic 0.

14. The method of claim 13 wherein a plateline decoder coupled to the platelines provides the plateline pulse to the selected column.

15. The method of claim 13 wherein the non-selected bitlines are floated.

16. The method of claim 15 wherein a plateline decoder coupled to the platelines provides the plateline pulse to the selected column.

17. The method of claim 6 wherein a plateline decoder coupled to the platelines provides the plateline pulse to the selected column.

18. The method of claim 5 wherein the plateline pulse is equal to logic 1 or logic 0.

19. The method of claim 18 wherein a plateline decoder coupled to the platelines provides the plateline pulse to the selected column.

20. The method of claim 18 wherein the non-selected bitlines are floated.

21. The method of claim 20 wherein a plateline decoder coupled to the platelines provides the plateline pulse to the selected column.

22. The method of claim 5 wherein the non-selected bitlines are floated.

23. The method of claim 5 wherein a plateline decoder coupled to the platelines provides the plateline pulse to the selected column.

24. The method of claim 1 wherein:
   performing the memory access selects x columns of memory cells, where x is a whole number greater than 1, n adjacent columns of each selected column are non-selected, where n is equal to at least 1; and
   providing plateline pulses to the x selected columns.

25. The method of claim 24 wherein 1, some or all x columns are selected for outputting data during the memory access.

26. The method of claim 25 wherein the plateline pulses are equal to logic 1, logic 0, or a combination thereof.

27. The method claim 26 wherein non-selected bitlines are set to a defined state.

28. The method of claim 27 wherein the defined state is selected to equal to logic 1, logic 0, reference voltage, or a combination thereof.

29. The method of claim 28 wherein the non-selected bitlines are floated.

30. The method of claim 27 wherein the non-selected bitlines are floated.

31. The method claim 25 wherein non-selected bitlines are set to a defined state.

32. The method of claim 31 wherein the defined state is selected to equal to logic 1, logic 0, reference voltage, or a combination thereof.

33. The method of claim 32 wherein the non-selected bitlines are floated.

34. The method of claim 31 wherein the non-selected bitlines are floated.

35. The method of claim 24 wherein the plateline pulses are equal to logic 1, logic 0, or a combination thereof.

36. The method claim 35 wherein non-selected bitlines are set to a defined state.

37. The method of claim 36 wherein the defined state is selected to equal to logic 1, logic 0, reference voltage, or a combination thereof.

38. The method of claim 37 wherein the non-selected bitlines are floated.

39. The method of claim 36 wherein the non-selected bitlines are floated.

40. The method claim 24 wherein non-selected bitlines are set to a defined state.

41. The method of claim 40 wherein the defined state is selected to equal to logic 1, logic 0, reference voltage, or a combination thereof.

42. The method of claim 41 wherein the non-selected bitlines are floated.

43. The method of claim 40 wherein the non-selected bitlines are floated.

* * * * *